(12) United States Patent
Alber (10) Patent No.: US 11,899,075 B2
(45) Date of Patent: Feb. 13, 2024

(54) DEVICE FOR DETERMINING AN ERROR PROBABILITY VALUE FOR A TRANSFORMER COMPONENT AND A SYSTEM HAVING SUCH A DEVICE

(71) Applicant: Maschinenfabrik Reinhausen GmbH, Regensburg (DE)

(72) Inventor: Alexander Alber, Regensburg (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 0 days.

(21) Appl. No.: 18/003,351

(22) PCT Filed: Jul. 2, 2021

(86) PCT No.: PCT/EP2021/068331
§ 371 (c)(1),
(2) Date: Dec. 27, 2022

(87) PCT Pub. No.: WO2022/028789
PCT Pub. Date: Feb. 10, 2022

(65) Prior Publication Data
US 2023/0194629 A1 Jun. 22, 2023

(30) Foreign Application Priority Data
Aug. 4, 2020 (DE) ..................... 10 2020 120 539.2

(51) Int. Cl.
*G01R 31/62* (2020.01)
(52) U.S. Cl.
CPC ................................ *G01R 31/62* (2020.01)

(58) Field of Classification Search
CPC .................................................... G01R 31/62
See application file for complete search history.

(56) References Cited

U.S. PATENT DOCUMENTS

| 2012/0215450 A1* | 8/2012 | Ashok ............... G05B 23/0262 |
| | | 702/9 |
| 2014/0222355 A1 | 8/2014 | Cheim et al. |

(Continued)

FOREIGN PATENT DOCUMENTS

| CN | 103986238 A | * | 8/2014 |
| CN | 102779230 B | | 1/2015 |

(Continued)

*Primary Examiner* — Kyle R Quigley
*Assistant Examiner* — Christine Y Liao
(74) *Attorney, Agent, or Firm* — LEYDIG, VOIT & MAYER, LTD.

(57) ABSTRACT

A device for determining an error probability value for a transformer component, including a signal input interface, a processor unit, and a storage unit, wherein the signal input interface is configured for direct or indirect coupling to a measurement system for a power transformer, the measurement system having multiple sensors that are each designed to record a physical and/or chemical property of the power transformer, the power transformer having multiple transformer components, and each sensor being coupled to at least one of the transformer components of the power transformer by way of a respective related direct or indirect connection, wherein the physical and/or chemical property of the power transformer recorded by the respective sensor is influenced by at least one of the transformer components, wherein the signal input interface is configured to receive a status signal of the measurement system, the status signal representing multiple, different status variables.

19 Claims, 4 Drawing Sheets

|  | T1 | T2 |
|---|---|---|
| 2nd W value for abnormal state | 0.2 | 0.3 |

|  | S1 | S2 |
|---|---|---|
| 1st W value for abnormal state | 0.2 | 0.3 |

|  | If T1 in abnormal state | If T2 in abnormal state | If T1 & T2 in abnormal state |
|---|---|---|---|
| 3rd W value for S1 in abnormal state | 0.5 | 0.8 | 0.8 |
| 3rd W value for S2 in abnormal state | 0.9 | 0.6 | 0.9 |

(56) References Cited

U.S. PATENT DOCUMENTS

2016/0274551 A1 9/2016 Mishra et al.
2019/0165988 A1 5/2019 Wang et al.

FOREIGN PATENT DOCUMENTS

| CN | 105678337 | A | * | 6/2016 | |
|----|-----------|---|---|--------|---|
| CN | 106372816 | A | * | 2/2017 | |
| CN | 106557607 | A | * | 4/2017 | ............ G01R 31/00 |
| CN | 104007343 | B |   | 4/2018 | |
| CN | 105069695 | B | * | 5/2019 | |
| CN | 110703151 | A | * | 1/2020 | |
| CN | 111208385 | A | * | 5/2020 | |
| CN | 111240306 | A | * | 6/2020 | |
| CN | 111272222 | A | * | 6/2020 | ............ G01D 21/02 |
| CN | 111272222 | A |   | 6/2020 | |
| DE | 102018206326 | B4 |   | 1/2020 | |
| EP | 3514908 | A1 |   | 7/2019 | |
| JP | 2007328522 | A |   | 12/2007 | |
| WO | WO-2019130165 | A1 | * | 7/2019 | |

* cited by examiner

| Pattern No | 1 | 2 | 3 | 4 | 5 | 6 | 7 | 8 | 9 | 10 | 11 | 12 |
|---|---|---|---|---|---|---|---|---|---|---|---|---|
| T1 | N | A | N | N | N | A | N | N | N | N | A | N |
| T2 | N | N | N | N | A | N | A | N | N | N | N | N |
| S1 | N | N | N | N | A | N | N | N | N | N | N | A |
| S2 | N | A | N | N | N | A | N | A | N | N | N | A |

Fig. 4

| Pattern No | 2 | | | | | | 8 | | | | |
|---|---|---|---|---|---|---|---|---|---|---|---|
| T1 | A | | | | | | N | | | | |
| T2 | N | | | | | | N | | | | |
| S1 | N | | | | | | N | | | | |
| S2 | A | | | | | | A | | | | |

Fig. 5

DEVICE FOR DETERMINING AN ERROR PROBABILITY VALUE FOR A TRANSFORMER COMPONENT AND A SYSTEM HAVING SUCH A DEVICE

CROSS REFERENCE TO RELATED APPLICATIONS

This application is a U.S. National Phase application under 35 U.S.C. § 371 of International Application No. PCT/EP2021/068331, filed on Jul. 2, 2021, and claims benefit to German Patent Application No. DE 10 2020 120 539.2, filed on Aug. 4, 2020. The International Application was published in German on Feb. 10, 2022 as WO 2022/028789 A1 under PCT Article 21(2).

FIELD

The present invention relates to systems and devices for determining an error probability value for a transformer component.

BACKGROUND

Transformers are known fundamentally from the prior art. They are transformers that are able to convert an input voltage into an output voltage. Usually, the input voltage is an AC input voltage and the output voltage is an AC output voltage. In a very simple configuration, the transformer has a primary coil and a secondary coil, which are coupled to one another by way of a common core. At least part of the coils and/or core may be arranged in a tank containing cooling liquid in order to cool the coils. The primary coil, the secondary coil, the core, the cooling liquid and the tank may each be a transformer component of the transformer. The transformer may also have further transformer components.

In practice, transformers are often monitored by means of a measurement system. The measurement system has multiple sensors that are designed to record physical and/or chemical properties of the transformer. A measurement system is often used when the transformer is in the form of a so-called power transformer. This is the case for example if the transferred electrical power from the primary coil to the secondary coil is greater than 10 kilowatts. During active operation, the two coils of a power transformer produce not inconsiderable heat, at least some of which is absorbed by the cooling liquid of the power transformer. The cooling liquid may be conveyed in a cooling liquid circuit of the power transformer, the cooling liquid circuit incorporating a so-called heat exchanger that is able to transfer the heat transferred to the cooling liquid to the surroundings and/or to another medium. The measurement system may therefore have, by way of example, a sensor that is designed to record the temperature of the cooling liquid of the power transformer. A fan may be arranged on the heat exchanger in order to achieve a desired cooling power. The electric current flowing through a fan motor of the fan may be recorded by means of a further sensor of the measurement system, for example. The cooling liquid used is often an oil, which may also be referred to as insulating oil. The insulating property of the oil prevents an electrical short within the coils or between the coils. The measurement system may have a further sensor, which is designed to directly or indirectly record a water content in the oil. As such, the sensor may be in direct contact with the oil, for example, in order to record the water content directly. However, there is also the possibility of a sensor being arranged in the tank of the power transformer, this sensor being designed to record a gas concentration with hydrocarbon chains. A gas concentration with hydrocarbon chains, recorded by the sensor, that is greater than a predetermined threshold value may suggest a specific minimum water content in the oil. A further sensor of the measurement system may be designed to record a mechanical winding tension force between the turns of one of the coils, for example. This sensor may be in the form of a sensor for recording a mechanical pressure or a mechanical force, for example, the sensor being arranged on the primary or secondary coil of the power transformer in such a way as to record the mechanical tension force of the respective coil. A further sensor of the measurement system may be arranged and/or designed to record the current through the primary or secondary coil. In addition, the measurement system may have a voltage sensor that is designed to record a voltage of the voltage present across the primary or secondary coil. A further sensor of the measurement system may be designed to record the state of the transformer bushings, for example, the sensor being designed to determine the capacitance and/or loss factor of the transformer bushings, for example. A further sensor of the measurement system may be designed to record vibro-acoustic signals, for example. This sensor may be contrived for example as a sensor for recording acoustic signals that are produced when a tap changer of the power transformer is operated. The measurement system may be designed to generate a status signal that represents multiple, different status variables. The measurement system may be designed to determine at least one of the status variables in each case on the basis of the sensor signal from precisely one of the sensors and/or one of the status variables in each case on the basis of multiple sensor signals from multiple sensors. Each of the sensors is arranged on the power transformer in order to record a physical and/or chemical property of the power transformer. The physical and/or chemical properties may therefore accordingly be physical and/or chemical properties of components of the power transformer. The components of the power transformer are also referred to as transformer components. The cooling liquid of the transformer may be a component of the power transformer, for example. However, the voltage or the current on the first or second coil of the power transformer may each also be a physical property of the power transformer. Each status variable determined by the measurement system represents a status state of the property of the power transformer recorded by the at least one associated sensor as a normal state N or as an abnormal state. If for example a status variable is determined on the basis of the sensor signal from the sensor for recording the temperature of the cooling liquid, then a normal state may be ascertained for the "cooling liquid" transformer component by the measurement system, specifically in particular if the temperature of the cooling liquid recorded by means of the sensor is less than a reference value. Otherwise, the measurement system may ascertain an abnormal state for the status state. There is therefore a functional relationship between each status variable and in each case at least one of the transformer components whose property is recorded directly or indirectly by means of the at least one related sensor. Each status variable is therefore also referred to as being coupled to at least one of the transformer components by way of a functional relationship.

The status variables determined by the measurement system may represent status states of the power transformer, specifically as a normal state or as an abnormal state in each case. If a status variable relates to a single transformer component, then in this case the status state may directly provide information about whether the respective transformer component is in a normal state or in an abnormal state. If a status variable is determined on the basis of multiple sensor signals from multiple sensors, on the other hand, there is often no direct, clear relationship between the status state represented by the respective status variable and a single transformer component. Rather, there may be a functional relationship between said status state and multiple transformer components. In addition, a transformer component may influence multiple sensor signals. A transformer component that is in an abnormal state may therefore lead to the measurement system ascertaining multiple status variables in such a way that the status variables each represent a status state as an abnormal state.

If multiple status variables represent an abnormal state as the status state, it is not always possible in practice to determine in a trivial and unambiguous manner whether and which of the transformer components are in an abnormal state or whether only a single transformer component that is in an abnormal state is the cause of multiple status variables alike representing an abnormal state as the status state.

SUMMARY

In an embodiment, the present disclosure provides a device for determining an error probability value for a transformer component, comprising a signal input interface, a processor unit, and a storage unit, wherein the signal input interface is configured for direct or indirect coupling to a measurement system for a power transformer, the measurement system having multiple sensors that are each designed to record a physical and/or chemical property of the power transformer, the power transformer having multiple transformer components, and each sensor being coupled to at least one of the transformer components of the power transformer by way of a respective related direct or indirect connection, wherein the physical and/or chemical property of the power transformer recorded by the respective sensor is influenced by at least one of the transformer components, wherein the signal input interface is configured to receive a status signal of the measurement system, the status signal representing multiple, different status variables, each status variable being associated with at least one of the sensors, wherein each status variable is in a functional relationship with at least one of the transformer components, each status variable representing a status state of the property of the power transformer recorded by the at least one associated sensor as a normal state or as an abnormal state, wherein a dataset is stored by the storage unit, the dataset having a related first probability value for each status variable relating to a likelihood that the respective status variable represents an incorrect state, the dataset having a related second probability value for each transformer component relating to a likelihood that an error has occurred in the respective transformer component, the dataset having a related third probability value for each of the functional relationships from one of the transformer components to one of the status variables relating to a likelihood that an error causes an abnormal state of the respective status variable in the respective transformer component, and wherein the processor unit is configured to determine a related error probability value for each transformer component, relating to the likelihood that an error has occurred in the respective transformer component, on the basis of a Bayesian network, which represents a directional graph from the transformer components to the status variables based on the first, second and third probability values, and on the basis of the status states represented by the status variables.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

In an embodiment, the present invention provides a device and a system that permit particularly simple evaluation of whether and which transformer component(s) of a power transformer is, or are, faulty. There is thus provision for a device for determining an error probability value for a transformer component. The device has a signal input interface, a processor unit and a storage unit. The signal input interface is designed for direct or indirect coupling to a measurement system for a power transformer, the measurement system having multiple sensors that are each designed to record a physical and/or chemical property of the power transformer, the power transformer having multiple transformer components, and each sensor being coupled to at least one of the transformer components of the power transformer by way of a respective related direct or indirect connection, and so the property of the power transformer recorded by the respective sensor is influenced by at least one of the transformer components. In addition, the signal input interface is designed to receive a status signal of the measurement system, the status signal representing multiple, different status variables, each status variable being associated with at least one of the sensors, and so each status variable is in a functional relationship with at least one of the transformer components, each status variable representing a status state of the property of the power transformer recorded by the at least one associated sensor as a normal state or as an abnormal state. Furthermore, a dataset is stored by the storage unit, the dataset having a related first probability value for each status variable relating to the likelihood that the respective status variable represents an incorrect state, the dataset having a related second probability value for each transformer component relating to the likelihood that an error has occurred in the respective transformer component, the dataset having a related third probability value for each of the functional relationships from one of the transformer components to one of the status variables relating to the likelihood that an error causes an abnormal state of the respective status variable in the respective transformer component. The processor unit is configured to determine a related error probability value for each transformer component, relating to the likelihood that the respective transformer component is in an error state, on the basis of a Bayesian network, which represents a directional graph from the transformer components to the status variables based on the first, second and third probability values, and on the basis of the status states represented by the status variables.

In regard to the power transformer and the measurement system, analogous reference is preferably made to the explanations mentioned at the outset. The measurement system and the power transformer are preferably not parts of the device. Rather, there is preferably provision for the signal input interface to be designed to receive the status signal of the measurement system. The status signal represents multiple, different status variables, each of which represents a status state of the property of the power transformer recorded by the at least one associated sensor of the measurement system as a normal state or as an abnormal state. The status state is preferably either the normal state or the abnormal state. That is to say that the receivable status signal is used in the device to provide multiple, different status variables that each represent an abnormal state or a normal state for an applicable property of the power transformer as the status state. However, only with a great deal of experience is it possible to read from the status variables which of the transformer components could actually be faulty. In order to obtain a repeatable and quantifiable statement in regard to a possible error in a transformer component, the device has a processor unit and a storage unit.

The storage unit stores a dataset that comprises a related first probability value for each status variable. This first probability value indicates for the respective status variable, preferably regardless of the respective actual status state represented by the status variable, a probability that the state represented by the respective status variable, that is to say normal state or abnormal state, is an incorrect state. If a status variable represents a normal state as the status state, for example, then there is a certain probability, specifically corresponding to the first probability value, that the status state represented by the status variable is actually not a normal state, but rather must be an abnormal state. If the first probability value is 0.05, for example, then there is a five-percent probability that the status state represented by the respective status variable is incorrect.

The dataset stored by the storage unit moreover comprises a related second probability value for each transformer component of the power transformer. The second probability value indicates a probability that an error might have occurred in the respective transformer component. Statistical surveys on transformers and/or practical experience may be used for example to determine that there are transformer components that fail more often than other transformer components of a power transformer. The statistical survey and/or the experience may therefore be used to infer what the statistical probabilities of errors in the transformer components are. Based on these statistical probabilities for the transformer components, the second probability values may therefore be predetermined. As such, a related second probability value may be predetermined for the primary coil of a power transformer, for example, that indicates a probability that the primary coil of the power transformer has an error. Accordingly, a related second probability value may be predetermined for a predetermined number of transformer components of a power transformer.

The dataset stored by the storage unit moreover comprises a related third probability value for each of the functional relationships from one of the transformer components to one of the status variables. The respective third probability value therefore indicates a probability that an error in the respective transformer component causes an abnormal state in the respective functionally related status variable. If a status variable is associated with precisely one sensor that is able to record a physical and/or chemical property of precisely one transformer component, then the third probability may represent whether an error in this transformer component leads to an abnormal state of the status variable conditioned by the sensor. However, there is also the possibility that a transformer component has a direct or indirect relationship to multiple sensors, as a result of which an error in the respective transformer component may influence multiple status variables alike. Whether this occurs for the multiple sensors and applicable status variables from a statistical point of view is represented by the related third probability values.

The preceding explanations at least indirectly reveal that the sensors and therefore also the status variables do not always permit direct inference of a state of precisely one transformer component that possibly has an error. Rather, it is usually the case that if one or more of the status variables represent an abnormal state as the status state, there is the possibility of multiple transformer components alike that may be faulty. In functional terms, there is therefore a directional relationship from the transformer components to the sensors and therefore also to the status variables, but not a clear relationship from the status variables to the transformer components. To still be able to infer a statement regarding which and whether one of the transformer components is faulty, the processor unit of the device is configured to determine a related error probability value for each transformer component on the basis of a Bayesian network and on the basis of the status states represented by the status variables, relating to whether the respective transformer component is in an error state. Each error probability value preferably indicates for the respective transformer components a probability (error probability) that the respective transformer component is in an error state. The error state may be understood as an abnormal state of the transformer component. If an error probability value of 0.001 is determined for a transformer component, for example, then there is a 0.1% probability that the respective transformer component is faulty. This is relatively small and is more likely to suggest that the respective transformer component is not faulty. If a related error probability value of 0.7 is determined for another transformer component by means of the processor unit, on the other hand, then this suggests that the respective transformer component has a 70% probability of being faulty. The determination of the error probability values is based on the Bayesian network and the status variables made available to the apparatus by a measurement system by way of the status signal. Bayesian networks are known fundamentally from the prior art. Further and more in-depth explanation is therefore not required at this juncture. In the case of the Bayesian network, the transformer components form a first group of nodes and the status variables form a second group of nodes, there being exclusively directional, functional relationships from each transformer component to at least one of the status variables.

The processor unit may be configured to implement the error probability values by evaluating the Bayesian network and by taking account of the actual status states, specifically for example by means of one of the following algorithms: sampling algorithm or variable elimination algorithm. Both algorithms are known fundamentally from the prior art. Other algorithms may also be used. The processor unit may be designed to execute each of the two algorithms or other algorithms. However, it may also suffice if the processor unit is configured to execute one of the two mentioned algorithms in order to determine the error probability values.

The Bayesian network used for determining the error probability values is represented by a directional graph from the transformer components to the status variables. The dataset has a respective first probability value for each of the transformer components, a respective second probability value for each of the status variables and a respective third probability value for each of the directional relationships from transformer component to state variable. As a result of the Bayesian network representing the graph as a directional graph from the transformer components to the state variables, this corresponds to a reproduction of the real statistical circumstances for the power transformer and the measurement system. Based on the Bayesian network, however, it is possible, by taking account of the actual status variables, to determine what error probability values and related error probabilities exist for the transformer components relating to the likelihood that the respective transformer component is in an error state, or in an abnormal state.

The device therefore affords the advantage that, despite the directional, functional relationship between the transformer components and the status variables, it is possible to infer quantitative error probability values for the transformer components that permit a statement about which of the transformer components has the highest probability of an error, for example.

One advantageous embodiment of the device is distinguished in that the processor unit is configured to take the Bayesian network, which represents a directional graph from the transformer components to the status variables based on the first, second and third probability values, as a basis for generating a multiplicity of patterns, each pattern representing a respective related model state for each status variable and for each transformer component as a normal state or an abnormal state. The processor unit is configured to determine a reference group of patterns from the multiplicity of patterns, and so, for each pattern in the reference group, the related model states for the status variables match the status states of the status variables of the status signal. The processor unit is moreover configured to determine a related error probability value for each transformer component, relating to the likelihood that the respective transformer component is in an abnormal state, on the basis of the model states for the transformer components from the patterns in the reference group.

The aforementioned embodiment of the device is based on the fundamental concept that a multiplicity of patterns are initially generated, and that the actual status states of the status variables are then taken as a basis for ascertaining which of the previously generated patterns are assigned to a reference group. The patterns from the reference group thus each have, for the status variables, model states that correspond to the actual status states represented by the status variables of the status signal that the device receives from the measurement system. In other words, the processor unit is used on the actual status states to ascertain which of the patterns for the applicable status variables have model states that correspond to the actual status states. The patterns ascertained in this manner form the patterns of the reference group. When ascertaining the patterns for the reference group, however, the model states for the transformer components are ignored. Rather, these are used in a further step to ascertain the error probability values of the transformer components.

As has already been explained hitherto, the status states cannot usually be used to infer the states of the transformer components directly. Each pattern from the reference group also has a related model state for each transformer component, however. The multiplicity of patterns in the reference group means that this results in a corresponding multiplicity of model states for each transformer component, the distribution of said model states being able to be used to infer a probability that the respective transformer component is in an abnormal state. The processor unit is therefore able to take the patterns in the reference group as a basis for determining, for each transformer component, an error probability value related to the respective transformer component that represents the probability that the respective transformer component is in an abnormal state.

The processor unit is designed to generate the multiplicity of patterns, each pattern representing a respective related model state for each status variable and for each transformer component as a normal state or an abnormal state. The dataset stored by the storage unit comprises a related first probability value for each status variable. The generation of the multiplicity of patterns generates a corresponding multiplicity of model states for each status variable, for example. This generation of the model states does not take place at random, however, but rather by taking account of the first error probability value, and so the model states for the status variables have a probability corresponding to the first probability value of being generated as an abnormal state. If the first probability value is 0.2, for example, then the multiplicity of model states for the related status variable are generated in such a way that 20% of the model states represent an abnormal state and the remaining 80% of the model states represent a normal state. The multiplicity of model states for the remaining status variables are generated analogously. Moreover, the same also applies to the model states for the transformer components. This is because the dataset represents a related second probability value for each transformer component. Each pattern represents a related model state for each transformer component as a normal state or as an abnormal state. This generation of the model states for the transformer components does not take place at random, however, but rather by taking account of the second error probability value, and so the model states for the transformer components have a probability corresponding to the second probability value of being generated as an abnormal state. If the second probability value is 0.15, for example, then the multiplicity of patterns are generated by the processor unit in such a way that 15% of the model states for the respective transformer component represent an abnormal state and the remaining 85% of the model states represent a normal state. In addition, it should be noted that the multiplicity of patterns are generated at random by taking account of the error probability values. The processor unit is of appropriate design for this purpose. The larger the multiplicity of patterns, the more precisely it is possible to determine for each transformer component a related error probability value indicating the respective probability concerning whether the respective transformer component is in an abnormal state.

A further advantageous embodiment of the device is distinguished in that the device has an output interface, the device being designed to generate an output signal that represents at least the highest of the error probability values and the related transformer component, and the device being designed to transmit the output signal by means of the signal output interface.

In the preceding embodiment, it was explained that a related error probability value is determined for each transformer component. If there are a plurality of transformer components, a corresponding number of error probability values is also determined. These error probability values may differ. The highest error probability value is the most relevant, however, since it indicates which of the transformer components is most likely to be in an abnormal state. The processor unit is thus preferably configured to ascertain the highest error probability value and the related transformer component from the plurality of error probability values. Moreover, the device, and in particular the related processor unit, is designed to generate an output signal that represents the highest error probability value and indicates the related transformer component. As such, the output signal may represent a transformer component using the digits "01" and the related error probability value as "0.7", for example. However, it is also possible for the output signal to represent the respective transformer component in clear text. As such, the output signal may represent the "cooling liquid" transformer component and the related error probability value using "0.7", for example. The signal output interface of the device may be used to transmit the output signal. The device may be of appropriate design for this purpose. The output signal may be transmitted to a display unit, for example, in order to visually display the error probability value represented by the output signal in association with the transformer component.

A further advantageous embodiment of the device is distinguished in that the device is designed to generate the output signal in such a way that the output signal represents at least the two or three highest error probability values and the related transformer components. In practice, the transformer component having the highest error probability value is often of most interest. However, the applicable error probability value continues to represent a probability, and so the related transformer component does not necessarily have to be faulty. In practice, therefore, the transformer components for which high error probability values have likewise been determined may also be of interest. The processor unit of the device may therefore be configured to ascertain the two or three highest error probability values. Moreover, the device, and in particular the related processor unit, may be designed to generate the output signal in such a way that the output signal represents the previously ascertained two or three highest error probability values and at least indicates the related transformer components. The preceding explanations relating to the highest error probability value and the output signal apply to the two or three highest error probability values and the related transformer components analogously. Furthermore, the output signal, which represents the two or three highest error probability values and the related transformer components, however, provides a person skilled in the art with the information concerning which transformer components may likewise be faulty, in particular if the transformer component for which the highest error probability value has been ascertained is in fact not faulty. A person skilled in the art is therefore able to continue their examination, and for example also to examine the transformer component for which the second highest error probability value has been determined.

A further advantageous embodiment of the device is distinguished in that the status variables represented by the status signal are ternary status variables that each represent precisely one status state from the following group of possible status states: normal state, abnormal state or non-installed state. This precludes the status state from being able to represent anything other than the normal state, the abnormal state or the non-installed state. Alternatively, there may also be provision for the group of possible states to be limited to two states, specifically normal state and abnormal state. In this case, the status state may represent either the normal state or the abnormal state, but no other state.

A further advantageous embodiment of the device is distinguished in that the processor unit is configured to generate the Bayesian network on the basis of the dataset. The Bayesian network is preferably a directional acyclic graph in which each node of the graph has associated probability values, and the dependencies of the nodes are likewise represented by probability values. In the present case, the Bayesian network represents a first group of nodes comprising status variables, each of which has an associated related first probability value. The second group of nodes of the Bayesian network is represented by the transformer components of the power transformer, each of these nodes having a respective associated related second probability value. The dependency of the status variables on the transformer components is represented by respective applicable third probability values. The first, second and third probability values are present in the dataset, the dataset being stored in the storage unit of the device. The processor unit is therefore able, in particular based on the preceding explanations, to generate the Bayesian network on the basis of the probability values from the dataset.

A further advantageous embodiment of the device is distinguished in that the Bayesian network is in the form of a bipartite graph that represents a first group of nodes, a second group of nodes and functional relationships from the first group of nodes to the second group of nodes, the first group of nodes being determined by the first probability values, the second group of nodes being determined by the second probability values and the functional relationships being determined by the third probability values. According to this variant embodiment, the Bayesian network is thus used as a specific Bayesian network in the form of a bipartite graph. This ensures that functional relationships go exclusively from the transformer components to the status variables, but that there is no opposite dependent relationship. In other words, the bipartite graph is designed in such a way that the status variables are dependent only on the properties of the transformer components, but that the properties of the transformer components are not dependent on the states of the status variables. Relationships other than the relationships mentioned hitherto are preferably precluded. As a result, all relationships between the transformer components and the status variables may be represented as a two-dimensional table, the entries in which are preferably ascertained by expert knowledge and easy to configure.

A further advantageous embodiment of the device is distinguished in that the processor unit is configured to generate the patterns by means of a likelihood weighting algorithm. This involves the processor unit preferably taking account of the first, second and third probability values of the dataset.

A further advantageous embodiment of the device is distinguished in that the processor unit is designed to generate the output signal in such a way that the output signal represents the related error probability values and transformer components as a first image in which the error probability values are graphically depicted and the transformer components are indicated and/or denoted. Such an image may depict the error probability values as a bar graph, for example, the respective related transformer component for each bar graph being indicated and/or denoted. By way of example, the respective transformer component may be indicated by a digit or denoted as text, such as for example "cooling liquid". The probability values may be graphically depicted quantitatively and/or qualitatively in the image. A qualitative depiction of a probability value may be represented by the shade and/or by a length of a bar, for example. A quantitative depiction of a probability value may be the numerical graphical depiction of the probability value, for example. The device is able to use the output signal for example to display an applicable image by means of a display unit of the device. However, there may also be provision for the output signal to be transmitted via the output interface. The processor unit and in particular the related output interface may be designed and/or configured for this purpose.

According to a second aspect of the invention, provision is made for a system that has a device and a display unit. The device is preferably designed according to the first aspect of the invention and/or one of the related advantageous embodiments. The display unit has a screen. The signal interface of the device is coupled to the display unit by way of a direct or indirect first signal connection in order to transmit the output signal to the display unit. The display unit is moreover designed to display a second image, indicating the transformer components and related error probability values, on the screen on the basis of the output signal. The aforementioned second image does not presuppose that there already needs to be a first image. In addition, reference is made to the advantageous embodiments, preferred features, effects and/or advantages that have been explained in association with the device according to the first aspect and/or one of the advantageous related embodiments analogously for the system according to the second aspect of the invention.

The system comprises the device and the display unit having the screen. The screen may be used to display the second image, which graphically depicts the at least one error probability value, represented by the output signal, and the related transformer components. This depiction may comprise a qualitative and/or quantitative depiction of the at least one error probability value and a quantitative and/or qualitative depiction of the at least one related transformer component. If the output signal represents the highest error probability value and the related transformer component, for example, the second image may graphically depict the highest error probability value and the related transformer component accordingly. The display unit may be physically separate from the device, and so the first signal connection also extends between the device and the display unit. The first signal connection may be a wired signal connection or a radio signal connection. In principle, however, it is also possible for the display unit to form an integral part of the device, and so the system consists of the device with the integrated display unit. The system may also have further parts.

A further advantageous embodiment of the system is distinguished in that the display unit is designed so that the second image displays the transformer components represented by the output signal in list form and the related error probability values qualitatively using different colors and/or bars. The error probability values may additionally also be displayed quantitatively by the display unit. Moreover, there is preferably provision for the display unit to be designed to display the error probability values in list form in an order based on the magnitude of the error probability values. As a result, an observer is provided in the shortest time with an overview of which of the transformer components are possibly in an abnormal state and which of these possible transformer components have the highest probability that the applicable abnormal state exists.

A further advantageous embodiment of the system is distinguished in that the system has a measurement system for the power transformer, the measurement system being coupled to the signal input interface of the device in order to transmit the status signal to the signal input interface, the measurement system having multiple sensors that are each designed to record the physical and/or chemical property of the power transformer. The power transformer has multiple transformer components. Each sensor is coupled to at least one of the transformer components of the power transformer by way of a respective related direct or indirect connection, and so the property of the power transformer recorded by the respective sensor is influenced by at least one of the transformer components. In regard to the measurement system, the sensors and the power transformer, analogous reference is made to the explanations mentioned at the outset. As such, the measurement system may have multiple sensors, each sensor being designed to record a physical and/or chemical property of the power transformer. It is not always possible in this case to also directly record the property of a desired transformer component. Often, a property of the power transformer is recorded by means of a sensor, this property being only indirectly dependent on the state of a transformer component. The measurement system may be arranged in direct proximity to the power transformer, the sensors of the measurement system being mounted directly on the power transformer in order to be able to record the applicable physical and/or chemical properties of the power transformer. Each of the sensors may be coupled to an evaluation unit of the measurement system, and so the measurement system is designed, by means of the evaluation unit, to generate the status signal. The evaluation unit of the measurement system may also be designed to transmit the status signal to the signal input interface of the device. In principle, it is preferred if the measurement system and the device are separate. However, it is also possible for at least part or all of the measurement system and the device to be of integral design. As such, the device may form part of the measurement system, for example, or vice versa.

A further advantageous embodiment of the system is distinguished in that the measurement system is designed to record at least two of the following properties of the power transformer by sensor: gas comprising hydrocarbon chains in the liquid insulating medium, water in the liquid insulating medium, fill level of the liquid insulating medium, voltage, electric current, winding tension force, rotation speed of a fan, electrical power of the fan motor, loudness of the fan, motor torque of a tap changer, switching sequence of the tap changer, temperature (e.g. hotspot temperature or top-oil temperature), vibro-acoustic intensity, and functionality of the dehumidifier, loss factor of one or more transformer bushings, capacitance of one or more transformer bushings, vibro-acoustic intensity of the tap changer. The power transformer preferably comprises a tank filled with cooling liquid. The cooling liquid is also referred to as insulating liquid or as insulating medium, since the cooling liquid is preferably of electrically insulating design. The cooling liquid may preferably be an oil, in particular a mineral oil. Often, the cooling liquid is an ester from rapeseed oil. That is to say that the cooling liquid, which may also be referred to as insulating liquid, is for example oil, preferably based on an ester, and particularly preferably is a liquid insulating medium such as rapeseed oil. The cooling liquid has preferably two main tasks. The cooling liquid is intended to cool the primary and secondary coils, and the cooling liquid is intended to be electrically insulating. The aforementioned tank preferably also contains the transformer core and the primary and secondary coils. Therefore, the greatest heat from the transformer is usually released in the tank. The cooling liquid is used to dissipate the heat caused at the coils. The transformer may therefore have a line system and a heat exchanger, which are designed and arranged in such a way as to route cooling liquid from the tank through the line system to the heat exchanger and back to the tank again, so that the heat can be dissipated by way of the heat exchanger. The power transformer is preferably designed to connect different electrical grids having different voltages. As such, the power transformer may electrically couple for example a first grid having a lower voltage to a second grid having a higher voltage, or vice versa, in order to transfer electrical energy from one grid to the other grid. The electrical grids are preferably each in three-phase form. A related current and a related voltage may therefore occur on each of three phases in each grid. The applicable currents and/or voltages may be recorded by sensor. To this end, the measurement system may have sensors designed and/or arranged as appropriate. Theoretically, all currents and voltages of the two grids may be recorded by sensors. In practice, usually only some of the currents and voltages in the two grids are recorded. The measurement system may therefore be designed to record some of the voltages and currents in the two grids to which the electrical power transformer may be coupled.

A further advantageous embodiment of the system is distinguished in that the display unit forms part of the measurement system. The measurement system is often arranged in direct proximity to the power transformer. The device may be arranged in a manner physically separate from the measurement system and the power transformer. In particular, there may be provision for the device to be formed by a computer network, in particular a cloud network, that comprises a data memory. It is therefore possible for the device to provide a processor unit having a particularly high processing power. Displaying the second image on the display device is advantageous particularly if the display device is part of the measurement system and therefore in direct proximity to the power transformer. The reason for this is that this information is often needed during maintenance and/or repair of a power transformer.

A further advantageous embodiment of the system is distinguished in that the system has a remote monitoring system, the signal output interface of the device being coupled to the remote monitoring system by way of a direct or indirect second signal connection in order to transmit the output signal to the remote monitoring system. The remote monitoring system is arranged separately from the device, the measurement system and the power transformer locally. The remote monitoring system may be formed by a control center, for example, in which a multiplicity of power transformers are monitored.

A further advantageous embodiment of the system is distinguished in that the remote monitoring system is in cloud-based form. The remote monitoring system may therefore be formed by a cloud network having a multiplicity of computer units.

A further advantageous embodiment of the system is distinguished in that the display device of the system forms part of the remote monitoring system. The display device may therefore be arranged separately from the device, the measurement system and the power transformer.

A further advantageous embodiment of the system is distinguished in that the system comprises the power transformer. The system may therefore comprise the power transformer, the measurement system and the device. Moreover, there may be provision for the system to additionally comprise the remote monitoring system.

Further features, advantages and opportunities for application of the present invention will emerge from the description of the exemplary embodiments that follows and the figures. All the features described and/or depicted in the figures, independently and in any combination, form the subject matter of the invention, regardless of their composition in the individual claims or the back-references therein. Furthermore, identical reference signs in the figures represent identical or similar objects.

Figure 1:
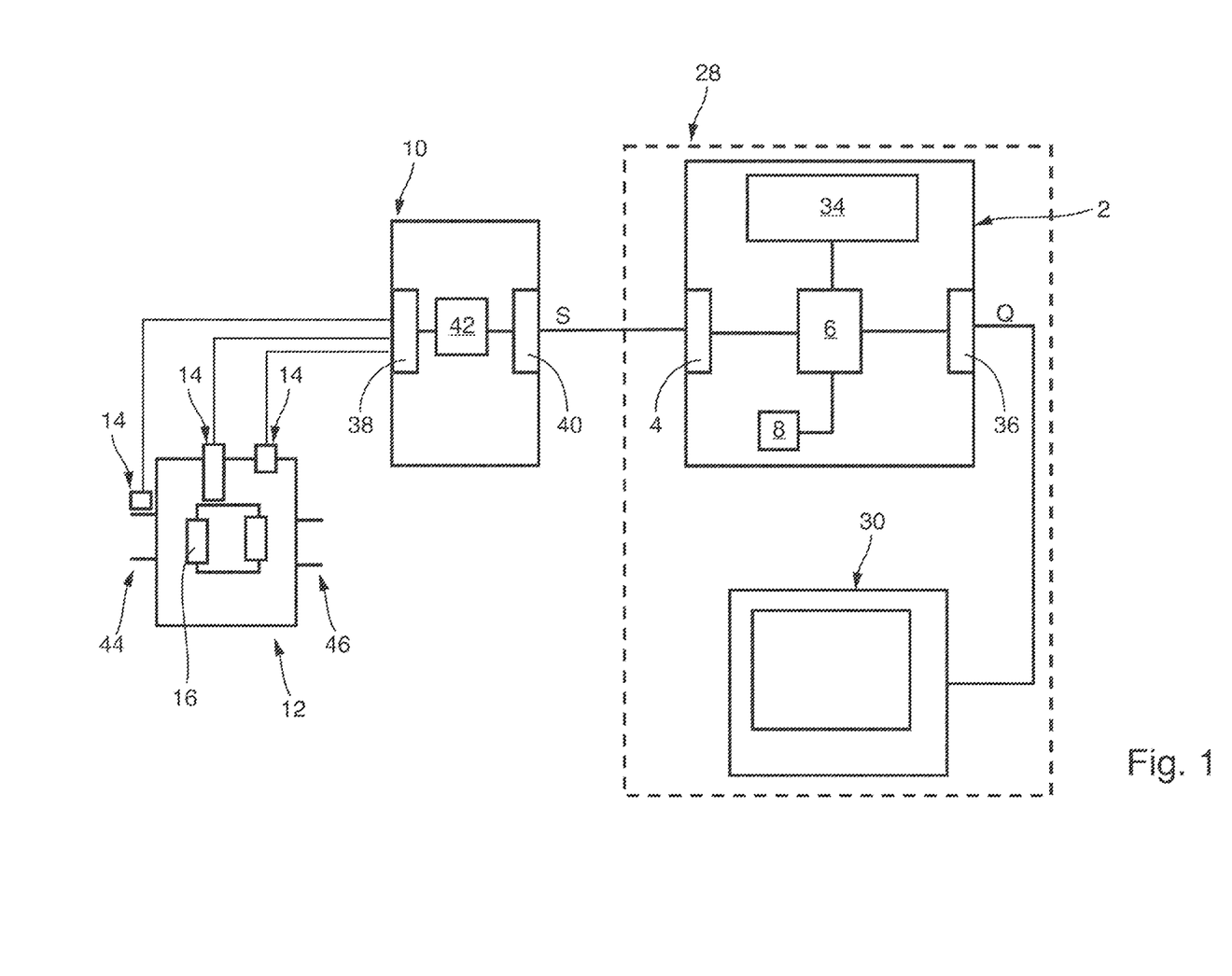
FIG. 1 shows a schematic depiction of an advantageous embodiment of the device and the system.

FIG. 1 schematically shows an advantageous embodiment of the device 2. The device 2 has a processor unit 6, a signal input interface 4 and a storage unit 8. The processor unit 6 is connected to the storage unit 8 in such a way that the processor unit 6 is able to access data stored in the storage unit 8. The processor unit 6 may therefore access a dataset stored in the storage unit 8, for example. Moreover, the processor unit 6 is connected to the signal input interface 4, and so a signal received by the signal input interface 4 is made available to the processor unit 6 directly or indirectly. By way of example, the signal input interface 4 is able to perform data preprocessing in order to make the data represented by the received signal available to the processor unit 6. It has been found to be advantageous if the device 2 has a signal output interface 36. A signal generated by the device 2, and in particular by the processor unit 6, such as for example an output signal Q, may be sent by means of the signal output interface 36. To this end, the processor unit 6 may be coupled directly or indirectly to the signal output interface 36 in order to directly or indirectly control the signal output interface 36, and so the signal output interface 36 may be used to send the output signal Q.

FIG. 1 moreover depicts an advantageous embodiment of the system 28, which comprises the device 2 and a display unit 30. The system 28 is schematically depicted by a dashed line in order to demonstrate that the display unit 30 does not necessarily have to be part of the device 2. The device 2 may have a dedicated display unit 34. The device 2 and the display unit 30 may be coupled by way of a signal connection running between the device 2 and the display unit 30, which is also referred to as the first signal connection. The first signal connection may extend from the signal output interface 36 of the device 2 to the display unit 30. The display unit 30 has a screen.

When the text below explains advantageous embodiments, preferred features, technical effects and/or advantages of the device 2, corresponding advantageous embodiments, preferred features, technical effects and/or advantages may apply to the system 28 analogously. Repetition is therefore dispensed with.

FIG. 1 schematically depicts not only the device 2 but also a measurement system 10 and a power transformer 12. The power transformer 12 has connections 44 on the primary side and further connections 46 on the secondary side. The power transformer 12 is used to transform a voltage from the primary side to the secondary side. Different electrical grids may be coupled to the primary side and the secondary side, and so electrical energy may be transferred from the primary side to the secondary side, or vice versa.

The power transformer 12 has a multiplicity of transformer components 16. As such, the power transformer 12 may have the connections 44, 46, a primary coil, a secondary coil, a core, a tank for cooling liquid, the cooling liquid, a cooling system, a heat exchanger, a fan for cooling the heat exchanger, a tap changer, a motor for driving the tap changer, bushings, valves, solid insulation for winding insulation and/or other technical components, for example, as transformer components 16.

The measurement system 10 comprises multiple sensors 14. Each of the sensors 14 is arranged on the power transformer 12, and so each sensor 14 is able to record a physical and/or chemical property of the power transformer 12. As such, a sensor 14 may be arranged in such a way as to record a temperature of the cooling liquid of the power transformer 12, for example. A further sensor 14 may be designed and/or appropriately arranged to record a mechanical tension force between the windings of the primary and secondary coils, for example. The tension force is also referred to as the winding tension force. The respective sensor 14 may therefore be designed to record the winding tension force. A further sensor 14 may be arranged in such a way as to record the voltage between the connections 44 on the primary side, for example. A further sensor 14 of the measurement system 10 may be designed to record the state of the transformer bushings, for example, the sensor being designed to ascertain the capacitance and/or loss factor of the transformer bushings, for example. A further sensor 14 of the measurement system 10 may be designed to record vibro-acoustic signals, for example. This sensor 14 may be contrived for example as a sensor for recording acoustic signals that are produced when a tap changer of the power transformer 12 is operated. The sensors shown in FIG. 1 are merely illustrative sensors 14. In fact, there may also be provision for many further sensors 14 and/or other sensors 14 for the measurement system 10. The sensors 14 may be designed to record forces, mechanical stresses, electric currents, voltages, temperatures, pressures, mass flows and/or acoustic sound.

Each of the transformer components 16 may have different properties, in particular different physical and/or chemical properties. In practice, it has been found that not all of the properties of a transformer component 16 are necessarily able to be recorded using a sensor 14. The temperature in a primary coil or a secondary coil may often be recorded only indirectly via the temperature of the cooling liquid, for example. There is therefore fundamentally a functional relationship between the temperature of the primary coil or secondary coil and the temperature of the cooling liquid recorded by a sensor 14. However, the recorded temperature of the cooling liquid cannot be used to directly infer whether and what temperature one of the two coils is at. In particular, if the cooling liquid is at an excessive temperature, it is not possible to unambiguously ascertain which of the two coils is in a faulty state, for example, and so the respective faulty coil delivers too much heat to the cooling liquid and causes the aforementioned excessive temperature of the cooling liquid.

The aforementioned example makes it clear that the physical and/or chemical properties of the power transformer 12 recorded by the sensors 14 are certainly able to provide an indication that one of the transformer components 16 is in a non-normal, that is to say abnormal, state. This non-normal, or abnormal, state is also referred to as the abnormal state of the respective transformer component 16. There is therefore a need for a device 2 to be provided that is designed to take the multiplicity of physical and/or chemical properties recorded by the sensors 14 as a basis for being able to determine a special estimate of whether and which transformer component(s) 16 are faulty when striking properties of the power transformer 12 are recorded by sensor.

The problem explained above is solved using the device 2 depicted by way of illustration and schematically in FIG. 1. The device 2 has the aforementioned signal input interface 4, which is designed for direct or indirect coupling to a measurement system 10. The measurement system 10 has multiple sensors 14, each of which is designed to record a physical and/or chemical property of the power transformer 12. The power transformer 12 has multiple transformer components 16. Each of the sensors 14 of the measurement system 10 is coupled to at least one of the transformer components 16 of the power transformer 12 by way of a respective related direct or indirect connection. This is preferably a functional connection. The direct or indirect connection between the sensors 14 and the transformer components 16 allows the technical effect to be achieved that the property of the power transformer 12 recorded by the respective sensor 14 is influenced by at least one of the transformer components 16.

The measurement system 10 may comprise an input interface 38, an output interface 40 and an evaluation unit 42. The sensors 14 are preferably coupled to the input interface 38, and so the properties recorded by the sensors 14 are transmitted to the evaluation unit 42, preferably by way of a sensor signal. The evaluation unit 42 may be designed to evaluate the properties recorded by the sensors 14 and to generate a status signal S that represents multiple, different status variables. Each status variable may indicate for example whether one of the sensors 14 has recorded a chemical and/or physical property of the power transformer 12 that is greater than a related limit value or less than an applicable limit value. The status signal S represents different status variables, wherein each status variable is associated with at least one of the sensors 14, and so each status variable is coupled to at least one of the transformer components 16 by way of a functional relationship. This is not a mechanical coupling but rather a functional coupling in the sense of a functional relationship. Each status variable represents a status state of the property of the power transformer 12 recorded by the at least one associated sensor 14 as a normal state N or as an abnormal state A. The status state may thus be either the normal state N or the abnormal state A, the respective status state being represented by the status variable. If a property of the transformer is the temperature of the cooling liquid, for example, then the status state may be the temperature of the cooling liquid in the normal state if the temperature is below a predetermined maximum temperature and in an abnormal state if the temperature reaches or is even greater than the maximum temperature.

The status signal S represents several of the different status variables. Moreover, the signal input interface 4 of the device 2 is designed to receive the status signal S of the measurement system 10. After the measurement system 10 has recorded the properties of the power transformer 12 by means of the sensors 14, the measurement system 10 may thus transmit the status signal S from a related output interface 40 of the measurement system 10 to the signal input interface 4 of the device 2.

The processor unit 6 of the device 2 is preferably coupled to the signal input interface 4, and so the status variables represented by the status signal S are made available to the processor unit 6. The processor unit 6 of the device 2 is configured to determine a related error probability value for each transformer component 16 on the basis of a Bayesian network 18 and on the basis of the status states represented by the status variable of the status signal, the respective error probability value indicating a probability that the respective transformer component 16 is in an error state. The error state may be an abnormal state of the respective transformer component 16.

Figure 2:
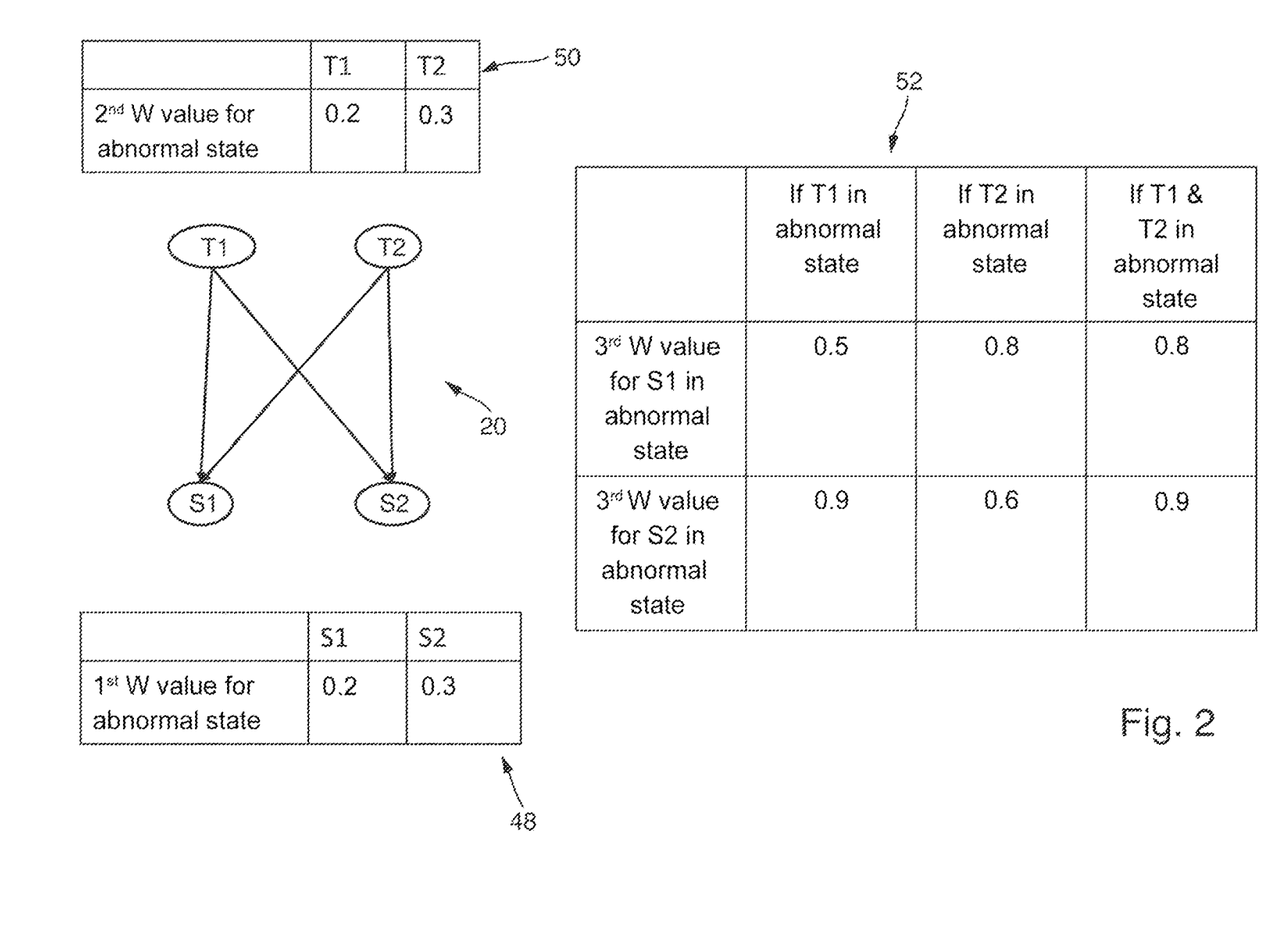
FIG. 2 shows a schematic depiction of an advantageous embodiment of the Bayesian network.

FIG. 2 depicts an example of a Bayesian network 18 of this kind that is contrived as a directional graph 20 from the transformer components 16, which are referred to as the first transformer component T1 and the second transformer component T2 in this case, to the status variables S1, S2. The directional graph 20 is based on the first probability values, the second probability values and the third probability values. The graph 20 is a directional, acyclic and bipartite graph, and so it only provides relationships from the transformer components T1, T2 to the status variables S1, S2. The status variables S1, S2 are thus dependent on the states of the transformer components T1, T2. However, the states of the transformer components T1, T2 are not dependent on the states of the status variables S1, S2. In addition, there are no relationships between the status variables S1, S2. There is also preferably provision for the graph 20 to map no relationships between the transformer components T1, T2. The transformer components T1, T2 form a first group of nodes of the graph 20. The status states S1, S2 form a second group of nodes of the graph 20. The probability values already mentioned hitherto will now be discussed below.

For each status variable S1, S2 there is provision for a related first probability value (1st W value) relating to the likelihood that the respective status variable S1, S2 represents an erroneous state. FIG. 2 depicts a first table 48, which reveals that there is provision for a related first probability value of 0.2 for the first status variable S1. For the second status variable S2, there is provision for a related first probability value of 0.3. The first probability value of 0.2 provided for the first status variable S1 thus indicates that the respective state represented by the status variable S1 is not correct. If the first status variable S1 represents the normal state N as the status state, for example, then there is a 20% probability that the normal state N is not correct, but rather that the actual state must be an abnormal state A. The same applies to the second status variable S2 and the related first probability value of 0.3.

For each transformer component T1, T2 there is provision for a related second probability value (2nd W value) relating to the likelihood that an error has occurred in the respective transformer component T1, T2. If the first transformer component T1 is formed by the primary coil and the second transformer component T2 is formed by the secondary coil, for example, then statistical surveys may be used to establish that for example there is a 20% probability that the primary coil has an error and a 30% probability that the secondary coil has an error. For each functional relationship, represented in the graph 20 by arrows, from one of the transformer components T1, T2 to one of the status variables S1, S2, there is a related third probability value (3rd W value) relating to the likelihood that an error in the respective transformer component T1, T2 causes an abnormal state A of the respective status variable S1, S2. That is to say that if for example the transformer component T1 is in an abnormal state A, then the third probability value for the relationship from the first transformer component T1 to the first status variable S1 is 0.5. That is to say that there is a 50% probability that if the transformer component T1 adopts the abnormal state A, then the status state represented by the status variable S1 is the abnormal state A. For the relationship between the transformer component T1 and the status variable S1, there is therefore provision for the related third probability value of 0.5. As may be seen from the graph 20, there is also a case from the transformer component T1 to the second status variable S2, however. It may be seen from the third table 52 that if the first transformer component T1 is in the abnormal state A then, based on the applicable third probability value, there is a 90% probability that the status state represented by the second status variable S2 is an abnormal state A. The device 2 has a storage unit 8, a dataset that comprises the first probability values, the second probability values and the third probability values being stored by the storage unit 8. The processor unit 6 of the device 2 is designed to read the dataset and/or the probability values from the dataset from the storage unit 8.

Based on the relationships explained hitherto between the first, second and third probability values and the graph 20, the processor unit 6 may use the applicable data to generate a Bayesian network 18 therefrom. However, it is also possible for the Bayesian network 18 to already exist, specifically on the directional graph 20 and the aforementioned probability values. The Bayesian network 18 may therefore represent a specific mapping between the transformer components 16, or T1, T2, and the status variables S1, S2. The status signal S from the measurement system 10 received by means of the signal input interface 4 of the device 2 represents multiple, different status variables, specifically status variables that are actually present in this case. On the basis of the Bayesian network 18 and the status states represented by the status variables of the measurement signal, the processor unit 6 is therefore able to determine a related error probability value for each transformer component 16, or T1, T2, relating to the likelihood that the respective transformer component 16, or T1, T2, is in an error state. Each error probability value thus indicates the probability that the respective transformer component 16, or T1, T2, is actually in this error state. The processor unit 6 may be configured to determine the error probability values by evaluating the Bayesian network 18 and by taking account of the actual status states, specifically for example by means of one of the following algorithms: sampling algorithm or variable elimination algorithm. The processor unit 6 may be designed and/or configured to execute the respective algorithm.

Figure 3:
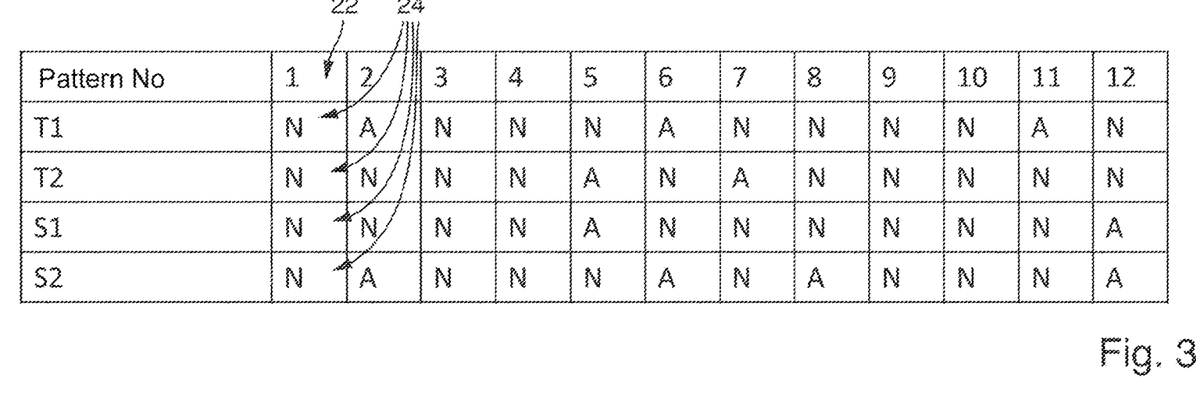
FIG. 3 shows an illustrative, tabular depiction of patterns.

In particular, the processor unit 6 is configured to take the Bayesian network 18 and the first, second and third probability values as a basis for generating a multiplicity of patterns 22, each pattern 22 representing a respective related model state 24 for each status variable and for each transformer component T1, T2, or 16, as a normal state N or as an abnormal state A. FIG. 3 depicts a table that shows a total of twelve patterns 22, consecutively numbered from No 1 to No 12, each pattern 22 representing a model state 24 for each transformer component T1, T2 and each status variable S1, S2 as a normal state (N) or abnormal state (A). Pattern No 1 therefore represents the model states N, N, N, N, specifically in the order for: first transformer component T1, second transformer component T2, first status variable S1 and second status variable S2. Accordingly, the second pattern No 2 represents the model states A, N, N, A. The further model states are revealed by the table shown in FIG. 3. The processor unit 6 generates the model states 24 in such a way that the probability values reproduced in the tables 48, 50, 52 are attained. To achieve this, a large multiplicity of patterns with related model states often need to be generated in practice. As such, there is for example provision for the processor unit 6 to be configured to generate a multiplicity of at least 10000 patterns 22. The multiplicity of patterns 22 depicted in FIG. 3 are therefore indicated merely by way of illustration, and do not require all of the conditions in the tables 48, 50, 52 to be satisfied. However, looking at the model states 24 in the patterns 22 for the first transformer component T1, it emerges from the model states 24 for the first ten patterns that two model states 24 represent the abnormal state A and the remaining model states 24 represent the normal state N. This results in a probability value for the abnormal state A of 20% for the first transformer component T1. The first table 48 in FIG. 2 depicts an applicable probability value for the abnormal state A for the first transformer component T1, specifically a probability value of 0.2.

Figure 4:
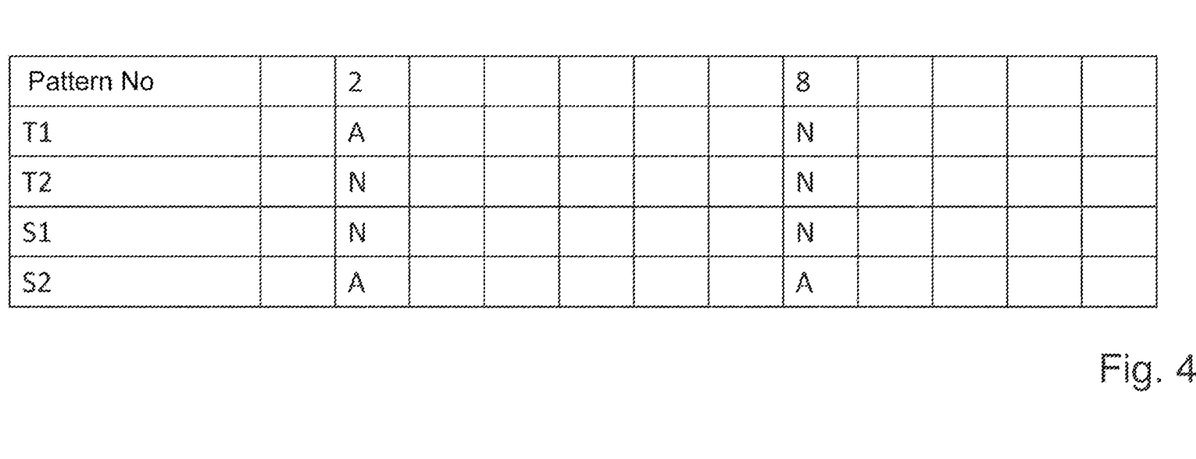
FIG. 4 shows an illustrative, tabular depiction of patterns in a reference group.

The measurement system 10 transmits a status signal S to the signal input interface 4 of the device 2, the status variables thereby transmitted representing each of the actual status states either as a normal state N or as an abnormal state A. If the first status variable S1 represents a normal state N and the second status variable S2 represents an abnormal state A, then it is possible to identify from the table in FIG. 3 precisely two patterns 22 indicating the first status variable S1 as a normal state N and the second status variable S2 as an abnormal state A. These are patterns No 2 and No 8. FIG. 4 depicts exclusively these two patterns Nos 2 and 8. The processor unit 6 is preferably configured to carry out an appropriate method step. There is therefore provision for the processor unit 6 to be configured to ascertain a reference group 26 of patterns 22 (in the example, patterns Nos 2 and 8) from the multiplicity of patterns 22 (FIG. 3), and so for each pattern (No 2 and No 8) in the reference group 26 the related model states 24 for the status variables S1, S2 match the status states of the status variables of the status signal S. Moreover, the processor unit 6 is configured to determine a related error probability value for each transformer component T1, T2, relating to the likelihood that the respective transformer component T1, T2 is in an abnormal state A, on the basis of the model states 24 for the transformer components T1, T2 from the patterns 22 (Nos 2 and 8) in the reference group 26. The table from FIG. 3 indicates the patterns (patterns Nos 2 and 8) in the reference group 26 that have status variables S1, S2 that correspond to the actual status variables S1, S2 determined by means of the measurement system 10. For each of the patterns 22 in the reference group, however, a model state 24 for each of the two transformer components T1, T2 is moreover indicated. The mean value of the indicated model states for the respective transformer component T1, T2 may be used to determine the error probability value for each of the transformer components. For the first transformer component T1, pattern No 2 indicates an abnormal state A and pattern No 8 indicates a normal state N. The mean value is thus 50%, and so the error probability value is 0.5 for the first transformer component T1. In the case of the second transformer component T2, the model state 24 in both patterns Nos 2 and 8 is indicated as a normal state N, and so the mean value is 100% normal state N. For the second transformer component T2, the error probability value is therefore 0. In summary, it may therefore be stated that if the measurement system 10 determines a normal state N for the first state variable and an abnormal state A for the second state variable, then the apparatus 2 is used to determine an error probability value of 0.5 for the first transformer component T1 and a related error probability value of 0 for the second transformer component T2. This means that the second transformer component T2 is in a normal state N and that the first transformer component T1 has a 50% chance of being in an error state, or abnormal state A. The error state or abnormal state A may be synonyms.

As schematically revealed by FIG. 1, the device 2 may be coupled to a separate display device 30 by way of a signal line. Alternatively or additionally, the device 2 may have an integrated display unit 34. The display unit 34 may be coupled to the processor unit 6. The processor unit 6 may be configured and/or designed to control the display unit 34 in such a way that the display unit 34 reproduces an image that graphically depicts the determined error probability values and indicates and/or denotes the related transformer components 16. As a result, a person looking at the display unit 34 of the device 2 is immediately able to tell which of the transformer components 16 has what probability of being in an abnormal state A, or error state. Experience has shown that such insight cannot be immediately and directly inferred from the status states generated by the measurement system 10.

It is possible for the device 2 to have an output signal interface 36, the device 2 being designed to generate an output signal Q that represents at least the highest of the determined error probability values and the related transformer component 16. Moreover, the device 2 is preferably designed and/or configured in such a way as to control the signal output interface 36 in such a way that the output signal Q is transmitted, in particular sent, by means of the signal output interface 36, specifically preferably to the display device 30.

It has already been explained hitherto that the device 2 may be part of a system 28, the system 28 having not only the device 2 but also the display unit 30 with a screen. The device 2 may be designed and/or configured to transmit the output signal Q to the display unit 30 by means of the signal output interface 36, and so the display unit 30 displays an image that graphically depicts the error probability value and indicates and/or denotes the related transformer component 16. The display unit 30 may be of appropriate design for this purpose. Between the signal output interface 36 and the display unit 30 there may be a signal connection, in particular a wired and/or radio-based signal connection.

Figure 5:
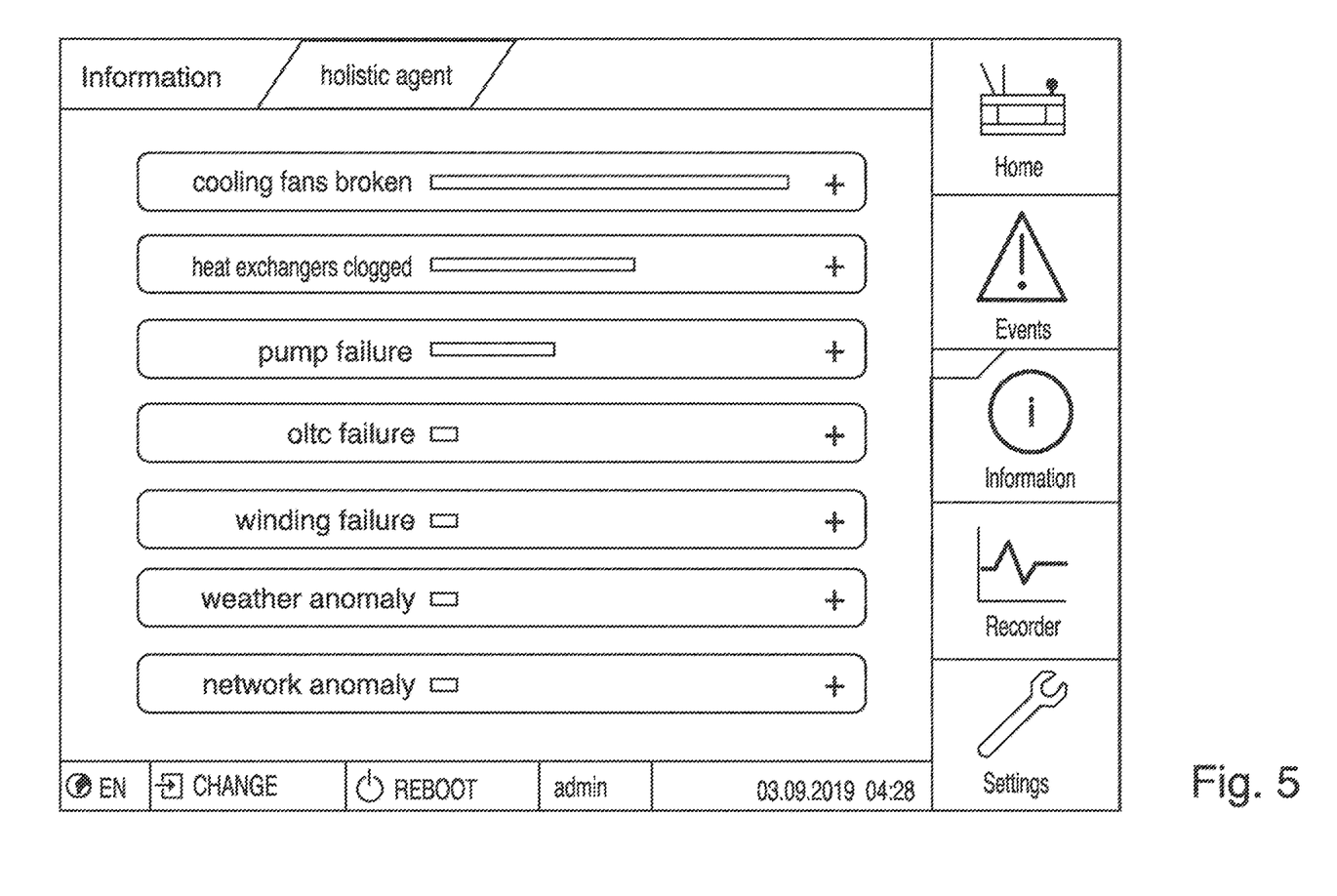
FIG. 5 shows an illustrative depiction of an image that may be reproduced on a display unit.

In practice, there is often interest in the transformer component 16 for which the highest error probability value was determined, since in this case it may be assumed that the related transformer component 16 is very probably in an abnormal state A. However, the error probability value represents a probability that the respective transformer component 16 is in an abnormal state A. There is thus still a residual probability that the respective transformer component 16 is not in the abnormal state A, but rather is in a normal state N. In practice, there is therefore often also interest in the second-highest or third-highest error probability value. There is therefore preferably provision for the device 2 to be designed to generate the output signal Q in such a way that the output signal Q represents at least the two or three highest error probability values and the related transformer components 16. The display unit 30 of the system 28 is preferably designed to display a second image, indicating the transformer components 16 and related error probability values, on the screen of the evaluation unit 30 on the basis of the output signal Q. As such, the display unit 30 may be designed so that the image displayed by the screen displays the transformer components 16 represented by the output signal Q in list form and the related error probability values qualitatively using different colors and/or bars. FIG. 5 depicts the screen image reproduced by the screen by way of illustration, this screen image comprising the aforementioned image in which the transformer components 16 are depicted in list form and the related error probability values are depicted qualitatively using (colored) bars and length of the bars. The longer the bar, the higher the error probability determined for the respective transformer component 16. The transformer components 16 are listed according to the magnitude of the error probability values, the transformer component 16 with the highest error probability value being arranged at the top. From this list-form depiction of the transformer components 16 and the related error probability values, a person is able to tell at a glance which of the transformer components 16 is most likely in an abnormal state A, and at the same time, from comparison of the color and/or length of the bars, to tell which of the other transformer components 16 likewise has a certain probability of being in an abnormal state A. This facilitates maintenance and/or troubleshooting in a power transformer 12.

The system 28 schematically depicted in FIG. 1 comprises the device 2 and the display unit 30. There may be provision for the system 28 to additionally comprise the measurement system 10 with the related sensors 14. The display unit 30 may be connected to the measurement system 10, or the display unit 30 may be integrated in the measurement system 10. In addition, it is possible for the system 28 to additionally comprise the power transformer 12.

The measurement system 10 may have a first sensor 14, which is designed to record a temperature of the cooling liquid in the tank of the power transformer 12. A further sensor 14 may be designed to record a mechanical stress or mechanical force acting on the primary coil. A third sensor 14 of the measurement system 10 may be designed to record a voltage between the connections 44 on the primary side of the power transformer 12. A fourth sensor 14 of the measurement system may be designed to record the loss factor and/or capacitance of one or more bushings of the power transformer 12. A fifth sensor 14 of the measurement system 10 may be designed to record acoustic signals produced when a tap changer of the power transformer 12 is operated. In addition, other sensors or further sensors 14 are also possible for the measurement system 10.

Moreover, there is preferably provision for the device 2 to be designed to periodically record the error probability values for the transformer components 16 again, specifically preferably whenever a status signal S containing new, multiple, different status variables has been received from the measurement system 10. The measurement system 10 may also be designed to periodically evaluate the properties of the power transformer 12 recorded by the related sensors 14. Whenever the properties have been periodically recorded by means of the related sensors 14, the measurement system 10 is able to transmit a status signal S to the signal input interface 4 of the device 2. The error probabilities for the transformer components 16 are then determined by means of the processor unit 6. In addition, the output signal Q may be updated by means of the processor unit 6 on the basis of the respective most recently determined error probabilities, and so an up-to-date image relating to which of the transformer components 16 have the highest probability of an error is always output on the display device.

Additionally, it will be pointed out that "comprising" does not preclude other elements or steps and "a" or "an" does not preclude a multiplicity. Furthermore, it will be pointed out that features that have been described with reference to one of the above exemplary embodiments may also be used in combination with other features of other exemplary embodiments described above. Reference signs in the claims should not be regarded as a restriction.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

A abnormal state
Q output signal
S status signal
N normal state
S1 status variable
S2 status variable
T1 transformer component
T2 transformer component
2 device
4 signal input interface of the device
6 processor unit
8 storage unit
10 measurement system
12 power transformer
14 sensor
16 transformer component
18 Bayesian network
20 graph
22 pattern
24 model state
26 reference group
28 system
30 display unit
34 display unit of the device
36 signal output interface of the device
38 input interface
40 output interface
42 evaluation unit
44 primary side connections
46 secondary side connections
48 first table (1st W values)
50 second table (2nd W values)
52 third table (3rd W values)

The invention claimed is:

1. A system, comprising:
a measurement system for a power transformer, the measurement system comprising:
multiple sensors that are each designed to record a physical and/or chemical property of the power transformer, the power transformer having multiple transformer components, and each sensor being configured to be coupled to at least one of the transformer components of the power transformer by way of a respective related direct or indirect connection, the physical and/or chemical property of the power transformer configured to be recorded by the respective sensor being influenced by at least one of the transformer components; and
a measurement device comprising:
a signal input interface directly or indirectly coupled to the measurement system;
a processor unit; and
a storage unit,
wherein the signal input interface is configured to receive a status signal of the measurement system, the status signal representing multiple, different status variables, each status variable being associated with at least one of the sensors,
wherein each status variable is in a functional relationship with at least one of the transformer components, each status variable representing a status state of the property of the power transformer recorded by the at least one associated sensor as a normal state or as an abnormal state;
wherein a dataset is stored by the storage unit, the dataset having a related first probability value for each status variable relating to a likelihood that the respective status variable represents an incorrect state, the dataset having a related second probability value for each transformer component relating to a likelihood that an error has occurred in the respective transformer component, the dataset having a related third probability value for each of the functional relationships from one of the transformer components to one of the status variables relating to a likelihood that an error causes an abnormal state of the respective status variable in the respective transformer component, and
wherein the processor unit is configured to determine a related error probability value for each transformer component, relating to the likelihood that an error has occurred in the respective transformer component, on the basis of a Bayesian network, which represents a directional graph from the transformer components to the status variables based on the first, second and third probability values, and on the basis of the status states represented by the status variables.

2. The device as claimed in claim 1, wherein the processor unit is configured to take the Bayesian network as a basis for generating a multiplicity of patterns, each pattern representing a respective related model state for each status variable and for each transformer component as a normal state or an abnormal state;
wherein the processor unit is configured to determine a reference group of patterns from the multiplicity of patterns, and, for each pattern in the reference group, the related model states for the status variables match the status states of the status variables of the status signal; and
wherein the processor unit is configured to determine a related error probability value for each transformer component, relating to the likelihood that the respective transformer component is in an abnormal state, on the basis of the model states for the transformer components from the patterns in the reference group.

3. The device as claimed in claim 1, wherein the device has an output interface, the device being designed to generate an output signal that represents at least a highest of the error probability values and the related transformer component, and the device being configured to transmit the output signal by the signal output interface.

4. The device as claimed in claim 1 wherein the device is designed to generate an output signal Q in such a way that the output signal Q represents at least the two or three highest error probability values and the related transformer components.

5. The device as claimed in claim 4, wherein the processor unit is configured to generate the output signal such that the output signal represents the related error probability values and transformer components as a first image in which the error probability values are graphically depicted and the transformer components are indicated and/or denoted.

6. A system, comprising:
the device as claimed in claim 4, and
a display unit having a screen,
the signal output interface of the device being coupled to the display unit by a direct or indirect first signal connection in order to transmit the output signal to the display unit, and
the display unit being configured to display a second image, indicating the transformer components and related error probability values, on the screen on the basis of the output signal.

7. The system as claimed in claim 6, wherein the system has a measurement system for the power transformer, the measurement system being coupled to the signal input interface of the device to transmit the status signal to the signal input interface, the measurement system having multiple sensors that are each configured to record the physical and/or chemical property of the power transformer, the power transformer having multiple transformer components, and each sensor being coupled to at least one of the transformer components of the power transformer by a respective related direct or indirect connection, and wherein the property of the power transformer recorded by the respective sensor is influenced by at least one of the transformer components.

8. The system as claimed in claim 7, wherein the measurement system is configured to record at least two of the following properties of the power transformer by sensor: gas comprising hydrocarbon chains in the liquid insulating medium, water in the liquid insulating medium, fill level of the liquid insulating medium, voltage, electric current, winding tension force, rotation speed of a fan, electrical power of a fan motor, loudness of the fan, motor torque of a tap changer, switching sequence of the tap changer, hotspot temperature, top-oil temperature, loss factor of one or more bushings of the power transformer, capacitance of one or more bushings of the power transformer, acoustic signals from a tap changer, vibro-acoustic intensity, and functionality of a dehumidifier.

9. The system as claimed in claim 6, wherein the display unit forms part of the measurement system.

10. The system as claimed in claim 6, wherein the system has a remote monitoring system, the signal output interface of the device being coupled to the remote monitoring system by a direct or indirect second signal connection to transmit the output signal to the remote monitoring system.

11. The system as claimed in claim 10, wherein the display unit forms part of the remote monitoring system.

12. The device as claimed in claim 1, wherein the status variables represented by the status signal are ternary status variables that each represent precisely one status state from the following group of possible status states: normal state, abnormal state, and non-installed state.

13. The device as claimed in claim 1, wherein the processor unit is configured to generate the Bayesian network on the basis of the dataset.

14. The device as claimed in claim 1, wherein the Bayesian network is a bipartite graph that represents a first group of nodes, a second group of nodes and functional relationships from the first group of nodes to the second group of nodes, the first group of nodes being determined by the first probability values, the second group of nodes being determined by the second probability values and the functional relationships being determined by the third probability values.

15. The device as claimed in claim 1, wherein the processor unit is configured to generate the patterns by a likelihood weighting algorithm.

16. The system as claimed in claim 1, wherein the display unit is configured so that the second image displays the transformer components represented by the output signal in list form and the related error probability values qualitatively using different colours and/or bars.

17. The system as claimed in claim 1, wherein the remote monitoring system is in cloud-based form.

18. A system comprising:
a power transformer;
a display unit having a screen,
a device for determining an error probability value for a transformer component, comprising:
a signal input interface;
a processor unit; and
a storage unit,
wherein the signal input interface is configured for direct or indirect coupling to a measurement system for the power transformer, the measurement system having multiple sensors that are each designed to record a physical and/or chemical property of the power transformer, the power transformer having multiple transformer components, and each sensor being coupled to at least one of the transformer components of the power transformer by way of a respective related direct or indirect connection, wherein the physical and/or chemical property of the power transformer recorded by the respective sensor is influenced by at least one of the transformer components,
wherein the signal input interface is configured to receive a status signal of the measurement system, the status signal representing multiple, different status variables, each status variable being associated with at least one of the sensors, wherein each status variable is in a functional relationship with at least one of the transformer components, each status variable representing a status state of the property of the power transformer recorded by the at least one associated sensor as a normal state or as an abnormal state,
wherein a dataset is stored by the storage unit, the dataset having a related first probability value for each status variable relating to a likelihood that the respective status variable represents an incorrect state, the dataset having a related second probability value for each transformer component relating to a likelihood that an error has occurred in the respective transformer component, the dataset having a related third probability value for each of the functional relationships from one of the transformer components to one of the status variables relating to a likelihood that an error causes an abnormal state of the respective status variable in the respective transformer components; and
wherein the processor unit is configured to determine a related error probability value for each transformer component, relating to the likelihood that an error has occurred in the respective transformer component, on the basis of a Bayesian network, which represents a directional graph from the transformer components to the status variables based on the first, second and third probability values, and on the basis of the status states represented by the status variables, and
wherein the device is designed to generate an output signal Q in such a way that the output signal Q represents at least the two or three highest error probability values and the related transformer components, and
the signal output interface of the device being coupled to the display unit by a direct or indirect first signal connection in order to transmit the output signal to the display unit, and the display unit being configured to display a second image, indicating the transformer components and related error probability values, on the screen on the basis of the output signal.

19. A system, comprising:
a power transformer comprising multiple transformer components;
a measurement system for the power transformer, the measurement system comprising: multiple sensors that are each designed to record a physical and/or chemical property of the power transformer, and are each coupled to at least one of the transformer components of the power transformer by way of a respective related direct or indirect connection, the physical and/or chemical property of the power transformer configured to be recorded by the respective sensor being influenced by at least one of the transformer components; and
a measurement device comprising:
a signal input interface directly or indirectly coupled to the measurement system;
a processor unit; and
a storage unit,
wherein the signal input interface is configured to receive a status signal of the measurement system, the status signal representing multiple, different status variables, each status variable being associated with at least one of the sensors,
wherein each status variable is in a functional relationship with at least one of the transformer components, each status variable representing a status state of the property of the power transformer recorded by the at least one associated sensor as a normal state or as an abnormal state;
wherein a dataset is stored by the storage unit, the dataset having a related first probability value for each status variable relating to a likelihood that the respective status variable represents an incorrect state, the dataset having a related second probability value for each transformer component relating to a likelihood that an error has occurred in the respective transformer component, the dataset having a related third probability value for each of the functional relationships from one of the transformer components to one of the status variables relating to a likelihood that an error causes an abnormal state of the respective status variable in the respective transformer component, and wherein the processor unit is configured to determine a related error probability value for each transformer component, relating to the likelihood that an error has occurred in the respective transformer component, on the basis of a Bayesian network, which represents a directional graph from the transformer components to the status variables based on the first, second and third probability values, and on the basis of the status states represented by the status variables.

\* \* \* \* \*